(12) United States Patent
Kitamura et al.

(10) Patent No.: US 6,735,856 B1
(45) Date of Patent: May 18, 2004

(54) APPARATUS FOR COMPONENT PLACEMENT

(75) Inventors: Naoyuki Kitamura, Yamanashi-ken (JP); Osamu Okuda, Yamanashi-ken (JP); Noriaki Yoshida, Ikeda (JP); Akira Kabeshita, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/435,836

(22) Filed: Nov. 8, 1999

(30) Foreign Application Priority Data

Nov. 9, 1998 (JP) ............................................. 10-317426

(51) Int. Cl.[7] ................................................ H05K 3/30
(52) U.S. Cl. .............................. 29/833; 29/834; 29/836; 29/743; 29/740; 29/721; 29/703
(58) Field of Search ................... 29/833, 743, 407.1, 29/703, 721, 740, 739, 834, 836; 483/58, 30, 56, 54

(56) References Cited

U.S. PATENT DOCUMENTS

| | | | | |
|---|---|---|---|---|
| 5,207,467 A | * | 5/1993 | Smith | .......................... 294/64.1 |
| 5,636,435 A | * | 6/1997 | Okumoto et al. | .............. 29/740 |
| 5,833,591 A | * | 11/1998 | Abe et al. | ..................... 483/122 |
| 5,996,203 A | * | 12/1999 | Abe et al. | ....................... 29/407 |

FOREIGN PATENT DOCUMENTS

| | | | |
|---|---|---|---|
| JP | 2132897 | * | 5/1990 |
| JP | 119198 | * | 4/2001 |

* cited by examiner

*Primary Examiner*—Carl J. Arbes
*Assistant Examiner*—Tai Nguyen
(74) *Attorney, Agent, or Firm*—Wenderoth, Lind & Ponack L.L.P.

(57) ABSTRACT

The present invention includes a component placement apparatus that can obtain information on the presence/absence of hold members inexpensively and easily, and a component placement method carried out by the component placement apparatus. A replacement hold member detector for detecting the presence/absence of replacement hold members at a hold member change part is installed at a placement head. The presence/absence is detected by moving an XY-robot so as to scan the hold member change part equipped with the replacement hold member detector. At the same time, type information attached to the replacement hold members is rendered readable by the replacement hold member detector. One replacement hold member detector is enough according to the apparatus and method of the present invention. The presence/absence information of the hold members can be obtained inexpensively and easily.

7 Claims, 9 Drawing Sheets

APPARATUS FOR COMPONENT PLACEMENT

BACKGROUND OF THE INVENTION

1. Field of the Invention

The present invention relates to an apparatus for placing electronic components onto circuit boards, and a component placement method executed by the apparatus.

2. Description of the Related Art

The variety of kinds of electronic components to be placed on circuit boards has increased recently. Accordingly, an apparatus that can handle various electronic components from micro-chip components to long connectors, etc. is strongly demanded. An example of a conventional apparatus of the above type will be described below with reference to FIG. 10. FIG. 10 shows a total view of a conventional component placement apparatus 20. In FIG. 10, reference numeral 1 indicates a transfer device for carrying in and out an electronic circuit board 2 with respect to the component placement apparatus 20 and positioning the circuit board 2 when electronic components are placed on the circuit board 2. Reference numeral 3 indicates a reel-type component feed device including reels 4 to which a tape temporarily securely holding the electronic components is wound. The feed device sends the tape from the reel 4 thereby feeding the electronic components one by one. A tray-type component feed device 5 is also set in the apparatus 20 to feed electronic components, and the electronic components are aligned in a grid pattern on a tray 6. Reference number 7 indicates a placement head having a component hold part 8 for holding a hold member 13 which sucks so as to hold the electronic components supplied from the reel-type component feed device 3 and the tray-type component feed device 5. According to the component placement apparatus 20, the hold member 13 is a nozzle that can suck the electronic component. Reference numeral 9 indicates an XY-robot for moving the placement head 7 in X, Y-directions orthogonal to each other with a plant to an optional position and positioning the placement head 7. Reference numeral 10 indicates a component recognition camera for measuring a suction attitude of the electronic component held by the hold member 13. Reference numeral 11 indicates a tool change part equipped with one or a plurality of hold members 13 replaced with the hold member 13 set at the component hold part 8. Reference numeral 12 indicates a control device connected to the above transfer device 1, reel-type component feed device 3, tray-type component feed device 5, placement head 7, XY-robot 9, component recognition camera 10, and tool change part 11 for controlling operations of these devices and the entire component placement apparatus 20.

In the above component placement apparatus 20, the hold member 13 sucks so as to hold the electronic components. However, the apparatus may be adapted to hold the electronic components, for instance, mechanically by a chuck mechanism. Although only one component hold part 8 is shown at the placement head 7 in FIG. 10, actually, a plurality of component hold parts 8 are arranged which are omitted in the illustration. Needless to say, the placement head 7 may be designed to keep only one component hold part 8.

The conventional component placement apparatus 20 of the above constitution operates in a manner as will be described below.

The hold members 13 of the placement head 7 are set as the component feed device 3 or component feed device 5 by the XY-robot 9. Each of the hold members 13 is lowered by the component hold part 8 in a Z direction orthogonal to the X, Y-directions to suck an electronic component to be placed on the circuit board 2. After the sucking, each hold member 13 is moved up by the component hold part 8. A plurality of electronic components held by the hold members 13 are sequentially moved by the XY-robot 9 over the component recognition camera 10. The component recognition camera 10 picks up the suction attitude of each electronic component at the hold member 13. Information on the recognized images is sent to the control device 12. The control device 12, after taking the information on the recognized images, calculates an amount of correction for each electronic component on the basis of an amount of displacement of the suction attitude from a placement attitude on the circuit board 2, and rotates the hold member 13 based on the correction amount about an axis in the Z direction. The control device 12 moves the XY-robot 9 to position the placement head 7 over the circuit board 2 and moves each component hold part 8 so that the electronic components are correctly placed sequentially at predetermined positions on the circuit board 2.

In the case where the hold member 13 not corresponding to the electronic component to be placed on the circuit board 2 is accidentally set at the component hold part 8, the XY-robot 9 is moved to move the placement head 7 over the tool change part 11 and this hold member 13 not corresponding to the electronic component to be placed is detached and retained at a vacant tool hold portion at the tool change part 11. The component hold part 8 is then moved to a tool hold portion, where the other hold member 13 corresponding to the electronic component to be placed is caught. The hold member 13 corresponding to the electronic component to be placed is thus set to the component hold part 8.

The component hold part 8 with the correct hold member 13 is moved to a feed position for the electronic component to be placed next and the above-described sequence of operations from suction to placement is repeated.

Electronic components of various kinds are sequentially placed in this manner on the circuit board 2.

The tool change part 11 will be depicted with reference to FIGS. 11 and 12. The tool change part 11 includes a holding mechanism (not shown) capable of holding the hold members 13. Each hold member 13 is inserted at a predetermined tool hold portion 14 corresponding to each hold member 13. Sensors 15 are installed at the tool hold portions 14 to detect the presence/absence of the hold member 13. Each sensor 15 is connected electrically to the control device 12. Thus the control device 12 can recognize whether or not the predetermined hold members 13 are set at the tool hold portions corresponding to the predetermined hold members 13. The sensor 15 is, specifically, a proximity sensor, a limit switch or the like known sensor.

The conventional tool change part 11 constituted as above has drawbacks. According to the related art, before starting the component placement apparatus 20, necessary hold members 13 are on standby at the predetermined tool hold portions 14 at the tool change part 11, and information on the presence/absence of the hold members 13 from the sensors 15 is recognized by the control device 12. That is, the sensor 15 is installed for each of the tool hold portions 14, thereby raising costs and making the wiring complicated. In order to distinguish the types of hold members 13 kept at the component hold parts 8, an increasing number of sensors 15 or a plurality of expensive sensors are necessitated at the tool change part.

SUMMARY OF THE INVENTION

The present invention is devised to solve the above problems and has for its object to provide a component placement apparatus that can obtain information on the presence/absence of hold members inexpensively and easily, and a component placement method carried out by the component placement apparatus.

In order to achieve the aforementioned objective, a component placement apparatus is provided according to a first mode of the present invention. The apparatus includes a placement head having a hold member that is detachable and replaceable corresponding to a component to be held for placing the component held by the hold member at an object to be placed. A hold member change part has a replacement hold member that can be fitted to the placement head where the hold member and the replacement hold member are exchanged by the placement head. The replacement hold member holds another component to place the other component at the object. The placement head has a replacement hold member detector for detecting presence/absence of the replacement hold member at the hold member change part.

Further, the replacement hold member detector detects the type of replacement hold member (type information) in addition to detecting the presence/absence of the replacement hold member.

Further, the component placement apparatus comprises a control device for making a judgement whether or not the replacement hold member corresponding to the other component to be placed at the object to be placed is present at the hold member change part on the basis of the type information of the replacement hold member corresponding to the other component to be placed at the object to be placed. The type information is sent out from the replacement hold member detector.

The type information is attached to the replacement hold member in the form of a type information indicator, and the replacement hold member detector optically reads the type information indicator.

The control device further makes a location and a type of each replacement hold member at the hold member change part correspond to each other on the basis of the information sent out from the replacement hold member detector.

A component placement method according to a second mode of the present invention includes scanning a replacement hold member set at a hold member change part so as to detect the presence/absence of the replacement hold member. It is then decided whether or not a hold member is exchangeable with the replacement hold member corresponding to a component to be held on the basis of the scanning. The hold member is exchanged with the replacement hold member corresponding to the component to be held and the component to be held with the replacement hold member is held. The component held with the replacement hold member is placed at an object to be placed.

According to the component placement apparatus in the first mode of the present invention and the component placement method in the second mode of the present invention, the replacement hold member detector is installed at the placement head to detect the presence/absence of replacement hold members at the hold member change part. The presence/absence of the replacement hold members is detected through scanning over the hold member change part. A sensor is thus eliminated from the hold member change part holding many kinds of components. A simple and inexpensive constitution is achieved.

BRIEF DESCRIPTION OF THE DRAWINGS

These and other objects and features of the present invention will become clear following description taken in conjunction with the preferred embodiment thereof with reference to the accompanying drawings, in which.

DETAILED DESCRIPTION OF THE PREFERRED EMBODIMENT

Figure 1:
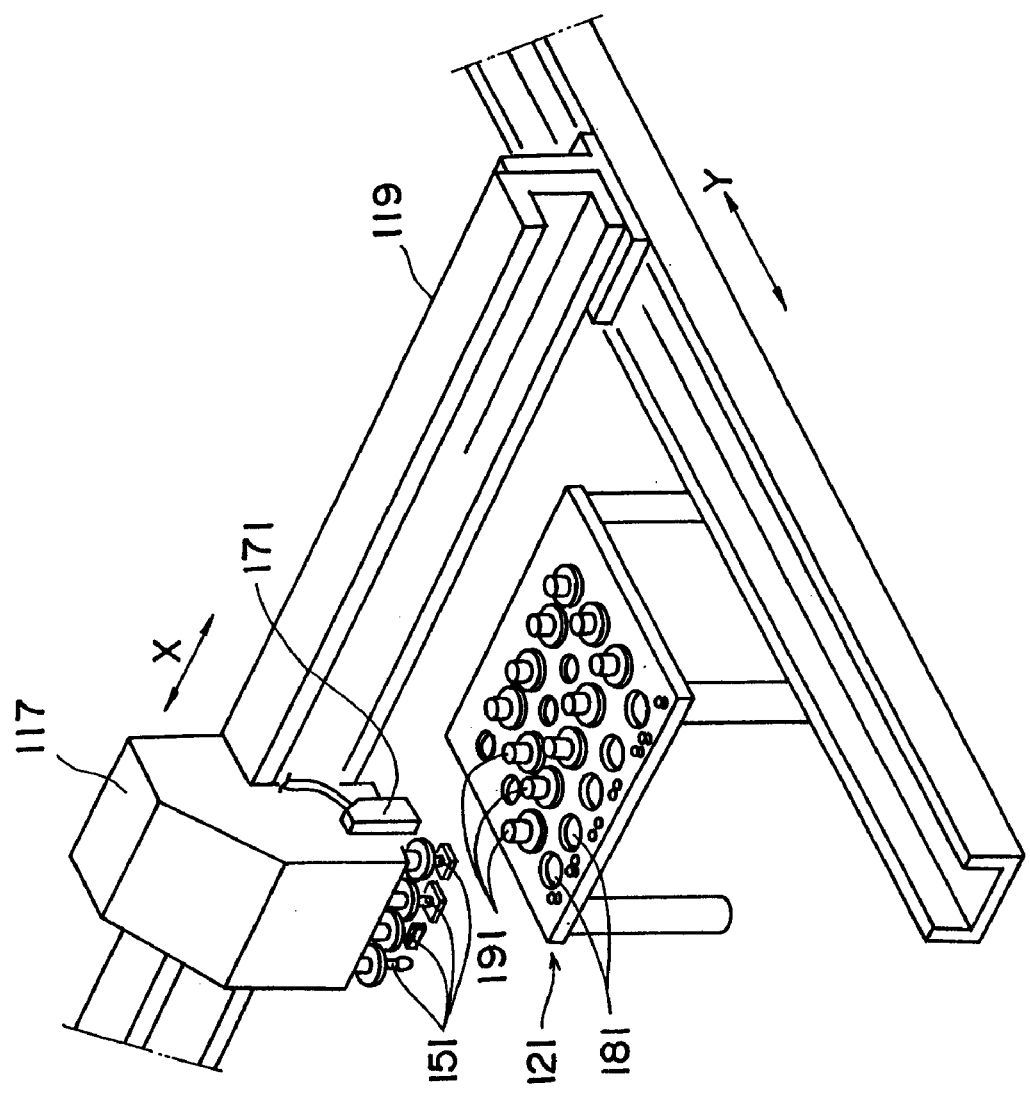
FIG. 1 is a perspective view of a placement head and a tool change part of a component placement apparatus according to a preferred embodiment of the present invention.

A component placement apparatus in a preferred embodiment of the present invention, and a component placement method executed by the component placement apparatus will be described hereinbelow with reference to the drawings. The same parts in the drawings are denoted by the same reference numerals. In the embodiment, an electronic component is discussed by way of example to function as the "component" described in the above "SUMMARY OF THE INVENTION". Likewise, a circuit board and a tool change part are exemplified, respectively, as the "object to be placed" and "hold member change part"

Figure 6:
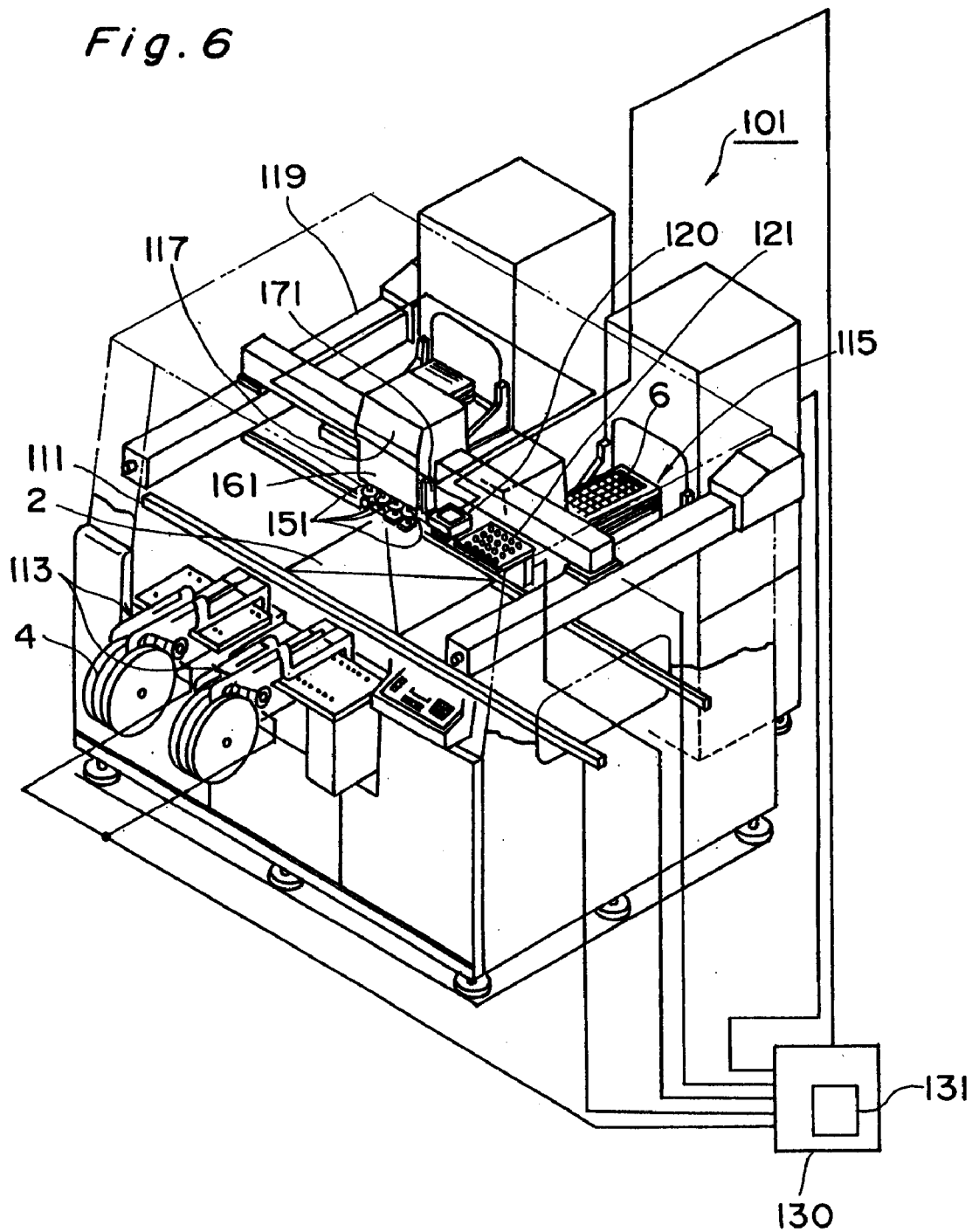
FIG. 6 is a perspective view of the entire component placement apparatus in the embodiment of the present invention.

As shown in FIG. 6, an essential construction of a component placement apparatus 101 in the embodiment is similar to the above-described conventional apparatus 20. More specifically, the component placement apparatus 101 includes a transfer device 111 for a circuit board 2, a reel-type component feed device 113, a tray-type component feed device 115, a placement head 117, an XY-robot 119, a component recognition camera 120, a hold member change part 121, and a control device 130. The transfer device 111 corresponds to the conventional transfer device 1. Similarly, the reel-type component feed device 113 corresponds to the conventional reel-type component feed device 3, the tray-type component feed device 115 corresponds to the conventional tray-type component feed device 5, the XY-robot 119 corresponds to the conventional XY-robot 9, and the component recognition camera 120 corresponds to the conventional component recognition camera 10. These devices have the same constitution and function as the conventional corresponding ones. Therefore, the description of these devices will be omitted here. A characteristic part of the component placement apparatus 101 in the embodiment is the placement head 117, hold member change part 121, and control device 130 which will be detailed below.

The placement head 117 has hold members 151 for sucking, similar to the related art, so as to hold electronic components, has component hold parts 161 for holding the hold members 151 removably and replaceably, and has a replacement hold member detector 171. The placement head 117 is loaded on the XY-robot 119 and made movable in X, Y-directions, similar to the conventional placement head 7. The hold members 151 can be moved by the component hold parts 161 in the Z direction. According to the embodiment indicated in the drawing, the placement head 117 has four hold members 151 and four component hold parts 161 corresponding to the hold members 151. However, the number of the hold members is not limited to this, and an optional count not smaller than one is possible. The hold members 151 can be driven independently separately by the corresponding component hold parts 161, the operation of which is controlled by the control device 130.

Although the electronic components are held through suction by the hold members 151 in the embodiment, a mechanical mechanism or the like may be adopted or the suction and mechanical operation may be mixedly executed at the placement head 117.

For the sake of description, the hold member set at the placement head 117 will be designated as the hold member 151, and the hold member kept at the hold member change part 121 to be described later will be denoted as a replacement hold member 191.

Tool hold portions 181 in which the replacement hold members 191 are inserted are arranged in a grid pattern on a flat plate of the hold member change part 121. Some of the tool hold portions 181 do not contain replacement hold members 191 so as to catch the hold members 151 from the placement head 117.

Figure 8:
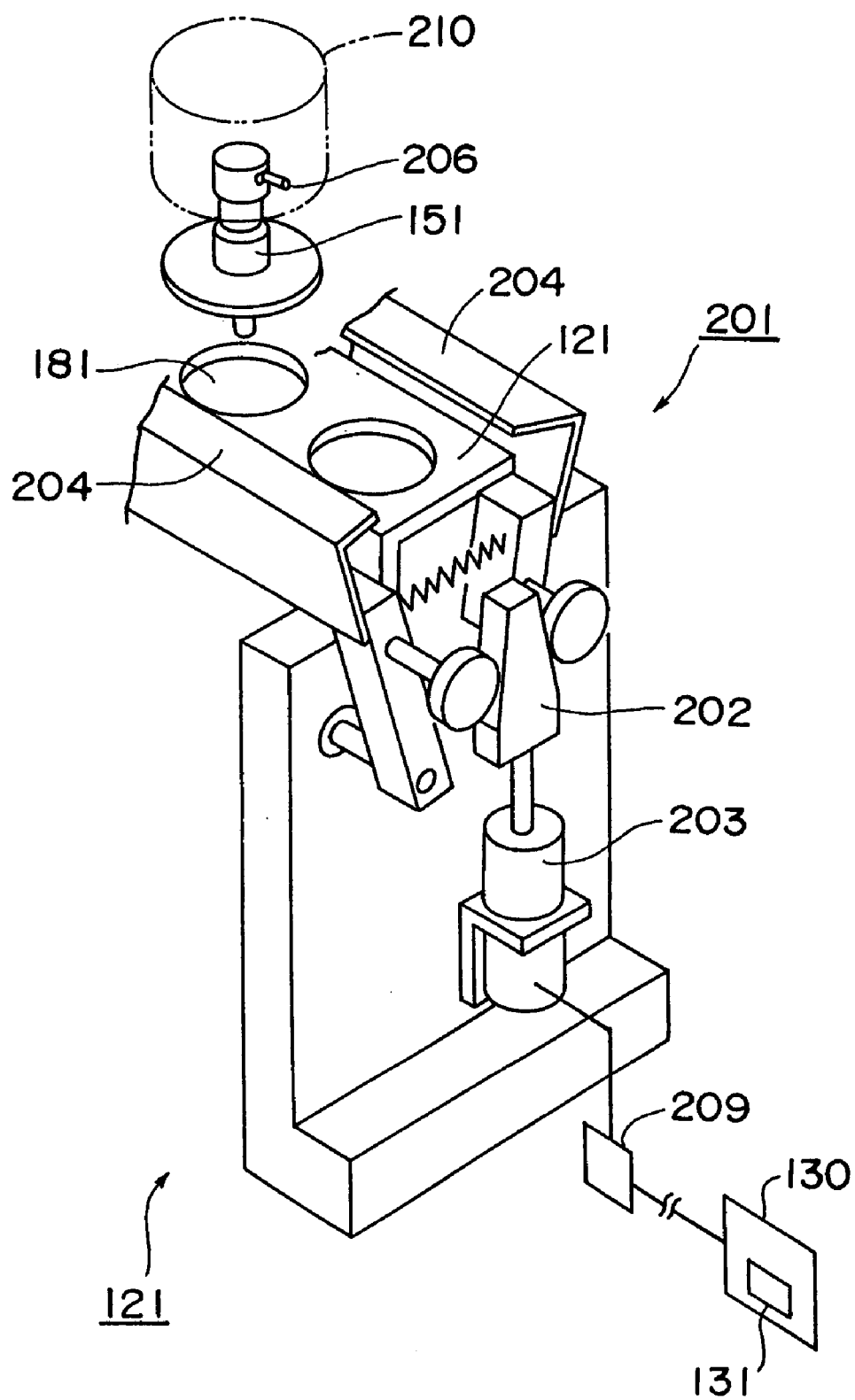
FIG. 8 is a perspective view showing in detail the structure of the tool change part of the component placement apparatus of FIG. 1.

The hold member change part 121 is constructed as shown in detail in FIG. 8. Specifically, the hold member change part 121 has a holding mechanism 201 for each array of the tool hold portions 181. The holding mechanism detaches the hold members 151 set at the placement head 117 and keeps them at the tool hold portions 181. In the holding mechanism 201, a pair of opening levers 204 are opened or closed in response to an up or down movement of a wedge-shaped cam 202 by a cylinder 203 which has an open sensor 209 to indicate the opening or closure of the opening levers 204. The cylinder 203 is controlled in operation by the control device 130 and the open or closure signal sent from the open sensor 209 is supplied to the control device 130.

Figure 9:
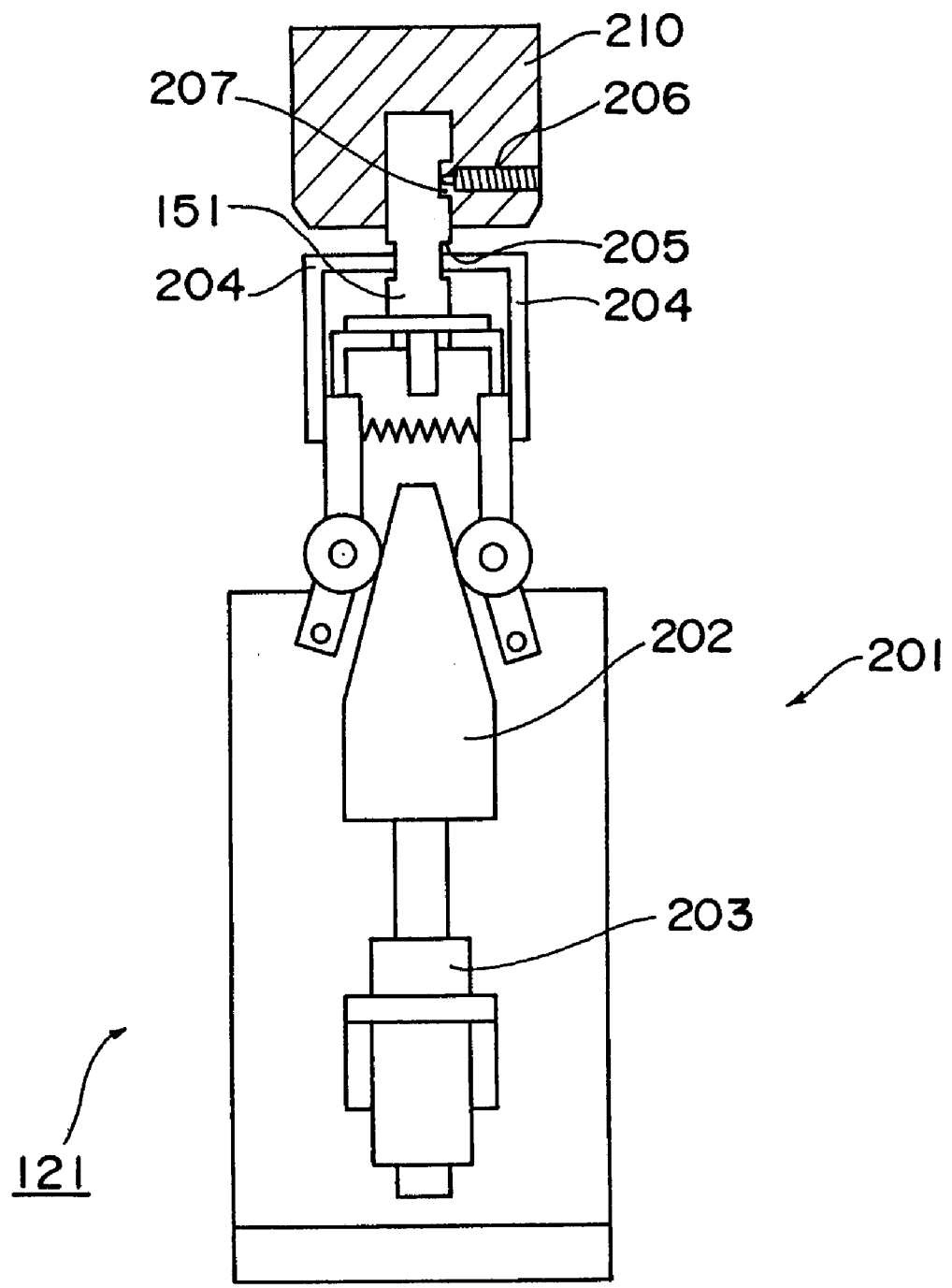
FIG. 9 is a side view of the tool change part of FIG. 8.
Figure 10:
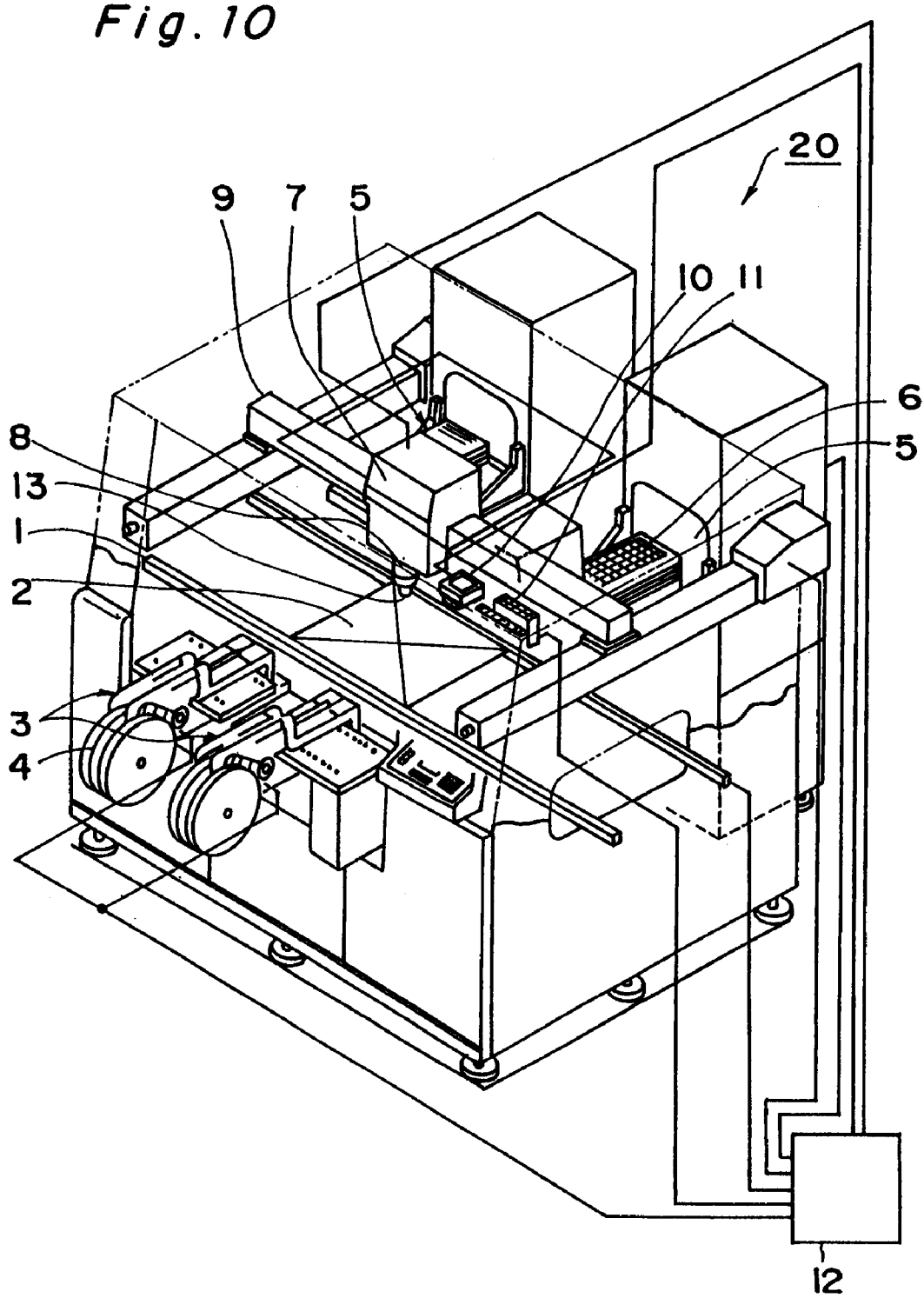
FIG. 10 is a perspective view of a conventional component placement apparatus.
Figure 11:
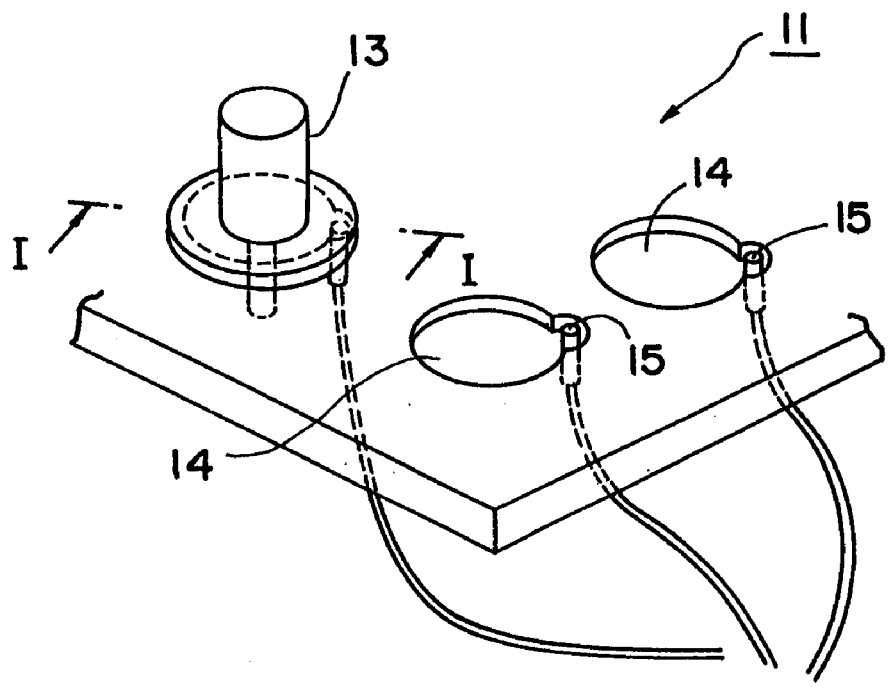
FIG. 11 is a perspective view of a tool change part shown in FIG. 10.
Figure 12:
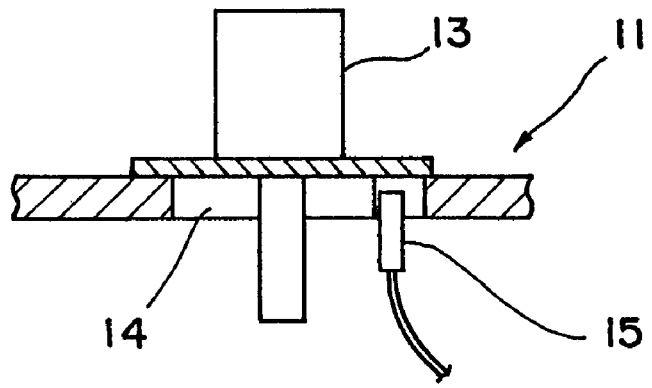
FIG. 12 is a sectional view taken along the line I—I of FIG. 11.

The above holding mechanism 201 operates in a manner as follows. Generally, the cam 202 is at an up position, with the opening levers 204 opened as shown in FIG. 8. When the cam 202 is lowered by the cylinder 203 after the hold member 151 is installed in the tool hold portion 181 of the tool change part 121 so as to be exchanged with the replacement hold member 191, the pair of opening levers 204 are closed. In consequence, as indicated in FIG. 9, the opening levers 204 are engaged with a groove 205 formed in the loaded hold member 151, thereby holding the groove 205 between the opening levers 204. The placement head 117 is raised in a state while the groove 205 is caught between the opening levers 204, whereby a ball plunger 206 is disengaged from a groove 207 of the hold member 151. Only the placement head 117 is allowed to move up while the hold member 151 is retained at the tool hold portion 181. Incidentally, the ball plunger 206 is set at a hold part 210 of the component hold part 161 of the placement head 117 for holding the hold member 151, which is engaged with the groove 207 of the hold member 151 when the hold member 151 is held with the hold part 210.

Figure 2:
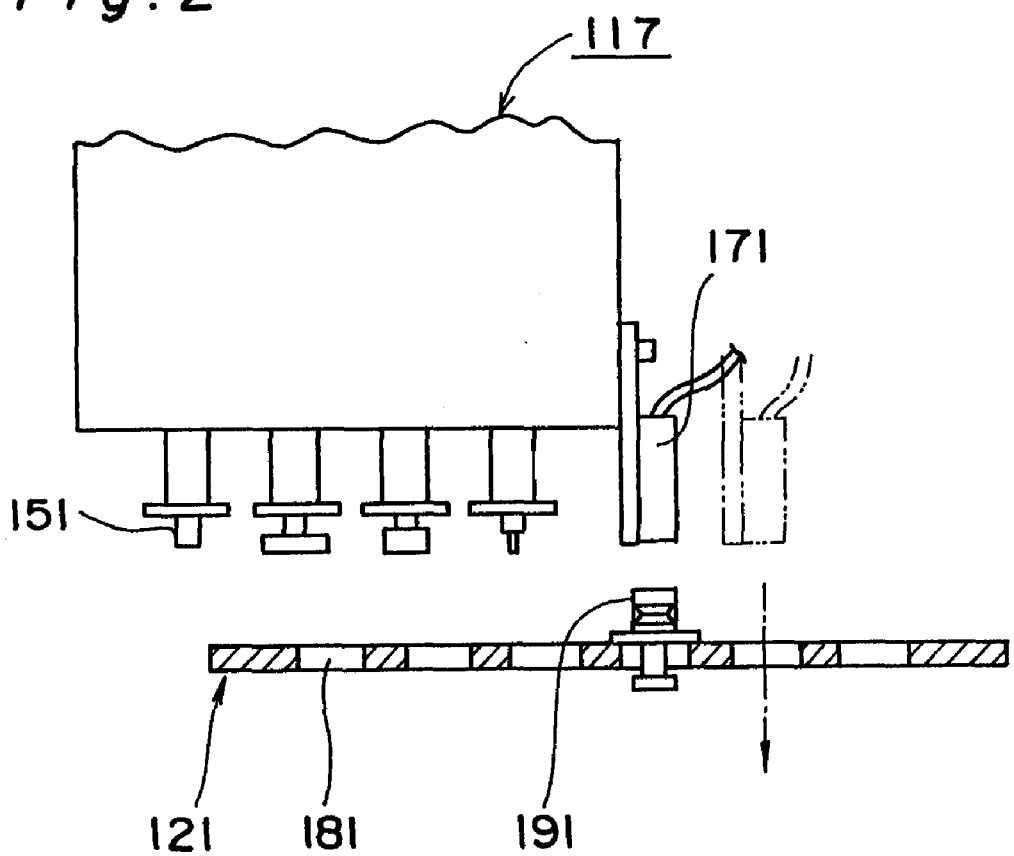
FIG. 2 is a diagram explanatory of a state in which a replacement hold member at the tool change part is detected by a replacement hold member detector installed at the placement head of FIG. 1.
Figure 3:
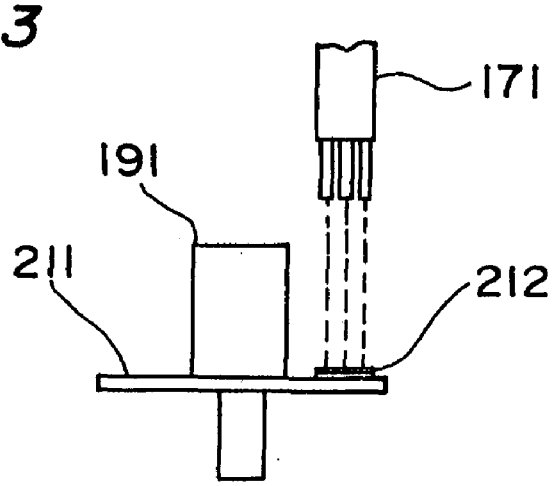
FIG. 3 is a diagram explanatory of a state in which information on the type of replacement hold member of the tool change part is detected by the replacement hold member detector installed at the placement head of FIG. 1.

The replacement hold member detector 171 has a sensor part installed at a casing of the placement head 117 to confront X, Y-planes. As indicated in FIG. 2, when the placement head 117 is moved in the X, Y-directions above the tool change part 121 by the XY-robot 119, the detector 171 detects whether or not the replacement hold member 191 which is to replace the above hold member 151 is present at the tool hold portion 181 of the tool change part 121. Moreover, according to the embodiment as shown in FIG. 3, the replacement hold member detector 171 detects type information attached to the replacement hold member 191 correspondingly to the electronic component to be held with the replacement hold member 191. The replacement hold member detector 171 is arranged at a set position of the placement head 117 to make a movement distance of the placement head 117 as small as possible in view of the placement operation for the electronic components to the circuit board 2. The replacement hold member detector 171 of the embodiment is a reflecting type detector that irradiates light to a part to be detected and optically recognizes the part from the reflecting wave of the irradiated light. Although the presence/absence of the replacement hold member 191 and the type information are both detected by one replacement hold member detector 171 according to the embodiment, this information may be detected separately by different detectors.

Position information obtained by the XY-robot 119, presence/absence information of the replacement hold member 191, and type information obtained from the replacement hold member detector 171 are fed to the control device 130. Before the electronic component is started to be placed on the circuit board 2, the control device 130 stores in a memory part 131 the presence/absence information and type information correspondingly for each tool hold portion 181 of the holding member change part 121 based on the above position information.

Figure 4:
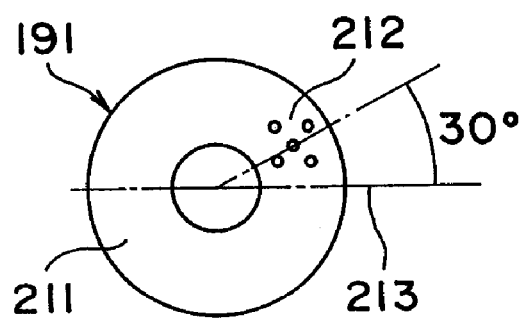
FIG. 4 is a plan view of the replacement hold member of FIG. 3.
Figure 5:
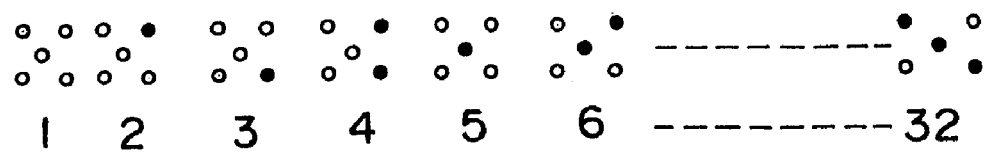
FIG. 5 is a diagram showing examples of type information marked at the replacement hold member of FIG. 3.

Referring to FIGS. 3 and 4, the above type information indicator 212, which represents the type of hold member 151 and the type of replacement hold member 191, is a mark of five spots formed in the same configuration as a five of a die on flange parts 211 of the hold member 151 and the replacement hold member 191. As shown in FIG. 5, each spot is colored with white or black so that the type information indicator 212 can represent 32 types of information in combination of white and black spots. Every replacement hold member 191 is stored at the hold member change part 121 such that the type information indicators of each replacement hold member 191 are arranged at the same position. For instance, every replacement hold member 191 is stored at the tool hold portion 181 so that the type information indicator assumes an angle of 30o in the counterclockwise direction to a center line 213 passing through the center of the replacement hold member 191 aligned in the X-direction and extending in the X-direction.

The operation of the component placement apparatus 101 constituted as above will be discussed now.

Figure 7:
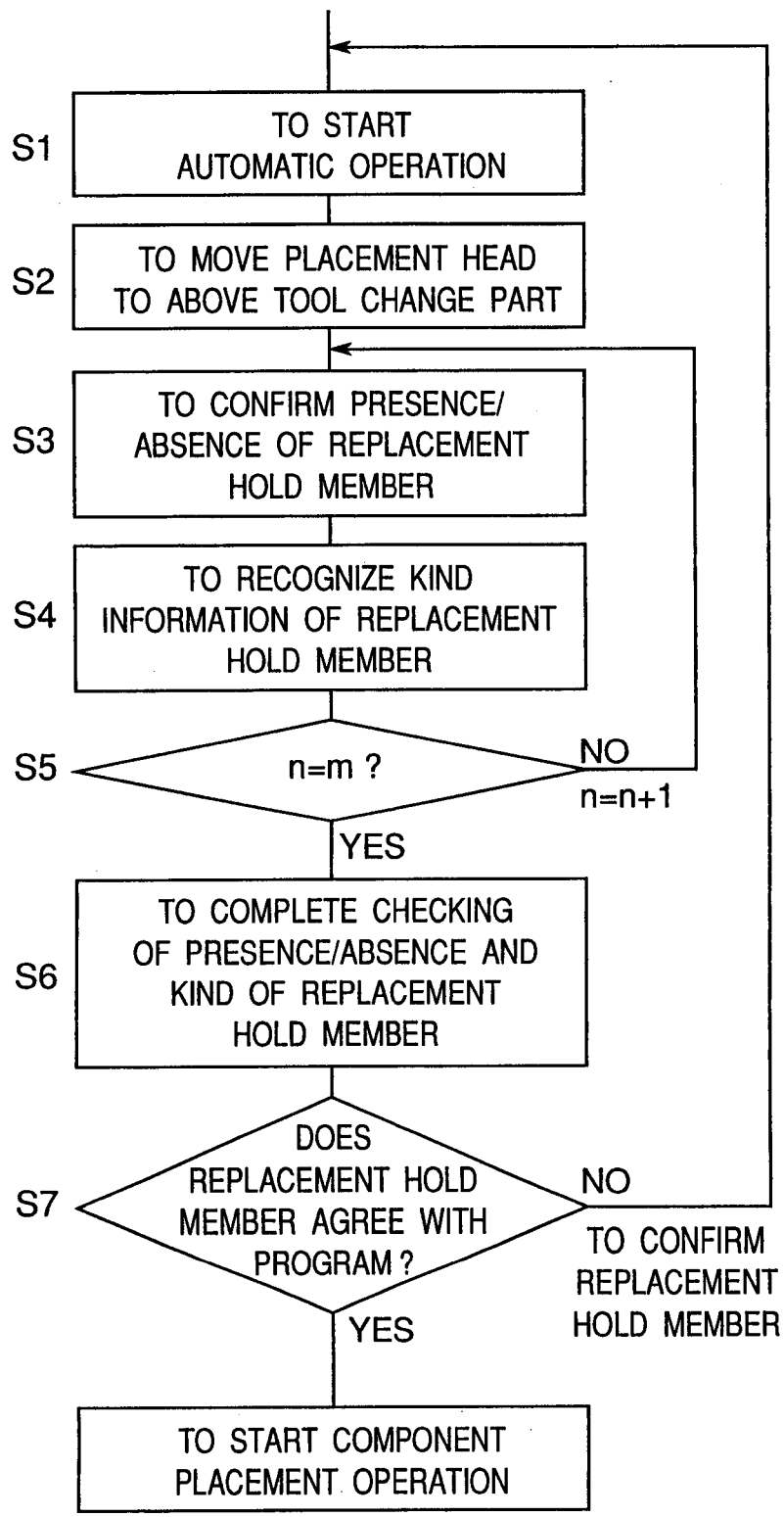
FIG. 7 is a flow chart of the detection operation for the replacement hold member at the tool change part in the component placement apparatus of FIG. 6.

In FIG. 7, when an automatic operation is ordered in step (denoted by "S" in the drawing) 1, the placement head 117 is moved by the XY-robot 119 so as to be positioned over the tool change part 121 in step 2. In steps 3–6, while the placement head 117 is moved in the X, Y-directions, the replacement hold member detector 171 installed at the placement head 117 scans the hold member change part 121 and detects whether the replacement hold members 191 are stored at the tool hold portions 181 of the tool change part 121, and scans the type information indicator attached to each replacement hold member 191.

Through the scanning, information on a movement amount in the X, Y-directions of the XY-robot 119, and the presence/absence information and type information of the replacement hold members are supplied to the control device 130 via a generated information signal. Based on the supplied information, the control device 130 stores position information of each tool hold portion 181 of the hold member change part 121 correspondingly to the presence/absence information and type information of the replacement hold member 191 at each tool hold portion 181 into the memory part 131.

According to the above operation, recognition is executed for each tool hold portion 181 (step 6). The control device 130 controls the placement of the electronic components on the basis of the recognized and stored information. Meanwhile, when the replacement hold members 191 are to be aligned beforehand at the hold member change part 121 to meet the order of types of electronic components to be placed, the control device 130 checks in step 7 whether or not the replacement hold members 191 are aligned in an order agreeing with the order of types of the electronic components. If the replacement hold members 191 are arranged wrong, the sequence from step 1 is tried again, after the arrangement is corrected. On the other hand, when the arrangement is correct, the placement of electronic components is started.

In executing the placement operation for the electronic components, information in which a placement position of the electronic component on the circuit board 2 and the electronic component to be placed are made to correspond to each other is supplied preliminarily to the control device 130, and information on the hold member 151 that can hold the electronic component to be placed is supplied as well. Therefore, the control device 130 automatically fits the hold member 151 that can hold the electronic component to be placed to the placement head 117 in the order of placement. When the need for replacing the hold member 151 of the placement head 117 arises, the control device 130 moves the placement head 117 to above the hold member change part 121, moves the component hold part 161 in the Z-direction, drives the holding mechanism 201 as depicted earlier to retreat the hold member 151 to a predetermined tool hold portion 181, and attaches the required replacement hold member 191 to the component hold part 161.

The electronic components are sucked from the component feed device 113 or 115 and placed on the circuit board 2 by using the hold members 151 corresponding to the electronic components placed on the circuit board 2 in the same manner as in the related art.

In the present embodiment as above, the replacement hold member detector 171 installed at the placement head 117 scans over the hold member change part 121 before the electronic components are started to be placed on the circuit board 2, thereby recognizing the presence/absence of the replacement hold members 191. When the hold members 151 are to be exchanged with the replacement hold members, they are prevented from being interfered with or forgotten to be replaced, etc. The location and type of the replacement hold members 191 at the tool change part 121 can be recognized by reading the type information attached to the replacement hold members by means of the scanning of the replacement hold member detector, thus enabling automatic exchange of the hold members.

Although the replacement hold member detector is adapted to recognize even the type information of the replacement hold members 191 according to the embodiment, it may be enough to detect at least the presence/absence of the replacement hold members 191.

As described herein, every time the automatic operation is ordered (that is, every time a circuit board is started to be produced), the presence/absence of the replacement hold members 191 and the type of the members 191 are confirmed in steps 3 through 6.

However, productivity might decrease sometimes when the above confirmation is conducted at every start time of the production. For solving this, the presence/absence of the replacement hold members 191 and the type of replacement hold members 191 may be adapted to be recognized only when any one of the following events (i)–(iv) occurs, whereby an amount of time necessary for the confirmation is saved and production efficiency is improved accordingly.

(i) Turning on the component placement apparatus 101;

(ii) Sending the open or closure signal from the open sensor 209 of the hold member change part 121;

(iii) Artificially exchanging the hold member 151, which leads to disagreement between the information stored in the memory part 131 of the control device 130 showing at which of the four points in the embodiment of the placement head 117 the hold member 151 is loaded and which type of hold member 151 is loaded and, the information on the location and type of hold member 151 actually fitted to the placement head 117; and (iv) Causing a malfunction of the component placement apparatus 101.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component placement apparatus comprising:

a placement head including a detachable hold member, said hold member corresponding to a component type so as to be operable to hold and place a component of the component type on an object;

a hold member change part including a replacement hold member, said replacement hold member being detachably attached to said placement head after said hold member is detached from said placement head so as to exchange said hold member for said replacement hold member, said replacement hold member being operable to hold and place a second component on the object, said replacement hold member having a type information indicator formed thereon for indicating a type of said replacement hold member;

a replacement hold member detector attached to said placement head, said replacement hold member detector being operable to detect said type information indicator of said replacement hold member and to generate an information signal based on said type information indicator; and a control device for determining whether said replacement hold member is present and for determining a type of replacement hold member present based on said information signal generated by and received from said replacement hold member detector.

2. The component placement apparatus of claim 1, wherein said hold member change part includes a plurality of replacement hold members, said control device having a storage portion and being operable to determine and store a location and a type of each of said replacement hold members based on said information signal generated by and received from said replacement hold member detector.

3. The component placement apparatus of claim 1, wherein said replacement hold member detector is operable to optically read said type information indicator.

4. The component placement apparatus of claim 1, wherein said hold member change part includes a plurality of replacement hold members, said type information indicator of each of said replacement hold members being located at the same position on each respective replacement hold member, said replacement hold members being arranged such that said type information indicator of each of said replacement hold members is oriented in the same manner.

5. The component placement apparatus of claim 4, wherein each of said replacement hold members includes a radially-extending flange, said type information indicator of each replacement hold member being located on said flange.

6. The component placement apparatus of claim 1, wherein said type information indicator indicates a type of said replacement hold member corresponding to a type of component to be held and placed by said replacement hold member.

7. The component placement apparatus of claim 1, wherein said hold member corresponds to a first component type so as to be operable to hold and place a component of the first component type on the object, said replacement hold member corresponding to a second component type so as to be operable to hold and place a component of the second component type on the object.

* * * * *